(12) United States Patent
Pesenti

(10) Patent No.: US 7,944,378 B1
(45) Date of Patent: May 17, 2011

(54) CIRCUITS AND METHODS FOR CALIBRATING ANALOG AND DIGITAL CIRCUITS

(75) Inventor: Sergio Pesenti, Vevey (CH)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/539,064

(22) Filed: Aug. 11, 2009

Related U.S. Application Data

(60) Provisional application No. 61/089,682, filed on Aug. 18, 2008.

(51) Int. Cl.
*H03M 1/06* (2006.01)
(52) U.S. Cl. .......................... 341/118; 341/155; 341/144
(58) Field of Classification Search .................. 341/155, 341/120, 172, 118, 161
See application file for complete search history.

(56) References Cited

U.S. PATENT DOCUMENTS

| | | | |
|---|---|---|---|
| 6,791,484 B1 * | 9/2004 | Lee et al. | 341/118 |
| 7,158,064 B2 * | 1/2007 | Jensen | 341/143 |
| 7,224,298 B2 * | 5/2007 | Lin | 341/120 |
| 7,408,490 B2 * | 8/2008 | Melanson et al. | 341/120 |

* cited by examiner

*Primary Examiner* — Brian Young

(57) ABSTRACT

In one embodiment the present invention includes a circuit for calibrating analog and digital circuits. The circuit includes an analog input stage, a discrete time processing stage, a DAC, and a calibration circuit. The analog input stage includes an input resistance and the DAC includes a capacitance. The input resistance and the capacitance set a time constant for the circuit. A reference signal is applied to the input of the analog input stage, and the calibration circuit generates a control signal to adjust the time constant. As the time constant is changed, a digitized signal at the output of the discrete time processing stage also changes. When the digitized signal crosses a threshold set by a digital reference signal, the time constant is calibrated.

20 Claims, 8 Drawing Sheets

100

CIRCUITS AND METHODS FOR CALIBRATING ANALOG AND DIGITAL CIRCUITS

CROSS REFERENCE TO RELATED APPLICATIONS

This application claims the benefit of U.S. Provisional Application No. 61/089,682, filed Aug. 18, 2008, the disclosure of which is incorporated herein by reference.

BACKGROUND

The present invention relates to mixed signal analog and digital circuits, and in particular, to circuits and methods for calibrating analog and digital circuits.

Electronic signal processing typically involves two different types of signals. Traditionally, electronic circuits processed signals as continuous waveforms, which are commonly referred to as analog signals. Accordingly, such circuits are referred to as analog circuits. As technology progressed, electronic circuits emerged where information was efficiently processed using digital signals, which are signals that only have discrete values representing, for example, zero (0) and one (1). Such circuits are referred to as digital circuits, digital processors, or digital signal processors, for example. However, the real world is an analog domain. Accordingly, for digital signal processing to be useful, it is often necessary to convert analog signals into to digital signals and convert digital signals into analog signals. Examples of systems that may use both analog and digital processing include wireless communications systems, control systems, or audio or video systems, for example.

Digital-to-analog converters ("DACs") and analog-to-digital converters ("ADCs") reside at the boundary between analog and digital domains. ADC circuits allow information represented by analog signals to flow into the digital domain for high speed, accurate, and cost effective digital processing. Once processed, DAC circuits allow the information to flow back into the analog domain for use in the real world. At the analog/digital boundary, analog circuits and digital circuits may be tightly coupled in operation and functionality. Conversion systems may integrate both types of circuits to perform the conversion task. Accordingly, these circuits are often call "mixed signal" or "hybrid" circuits because the circuits include both analog and digital features and components.

It is typically desirable to perform the conversion process with as much accuracy as possible. However, the analog circuitry in a conversion system may include components that vary across manufacturing processes. As a specific example, many analog circuits may include time constants implemented using capacitors and resistors that may exhibit an overall tolerance of up to 30% or more. However, a tolerance of just a few percentage may be required for the circuit to operate properly within the conversion system. In such cases, errors in the analog system can propagate and magnify as signals flow from the analog domain into the digital domain. Typically, the requirements on overall system accuracy are such that uncorrected manufacturing variations in the analog domain can render the system inoperable.

Traditional approaches for improving the accuracy of circuits are typically limited to one domain or the other. For example, existing approaches for improving analog circuit accuracy often include trimming or calibration techniques that focus on the specific values of particular components in the analog circuit. Digital domain accuracy is typically addressed by increasing the number of bits used to represent a signal and by various digital signal processing techniques.

SUMMARY

Embodiments of the present invention improve calibration of analog and digital circuits. In one embodiment the present invention includes a circuit comprising an analog input stage configured to receive an analog input signal through an input resistance and produce an analog output signal. A discrete time processing stage is configured to receive the analog output signal and generate a digitized signal from the analog output signal. A digital-to-analog converter is configured to receive the digitized signal and generate an analog feedback signal to the analog input stage. The digital-to-analog converter includes a capacitance. A calibration circuit is configured to receive the digitized signal and a digital reference signal and generate a control signal. The input resistance and the capacitance set a time constant, and the control signal adjusts the time constant to change the digitized signal until the digitized signal meets or crosses a threshold set by the digital reference signal.

In another embodiment, the present invention includes a calibration method comprising receiving an analog input signal in an analog input stage through an input resistance to produce an analog output signal, converting the analog output signal into a digitized signal, converting the digitized signal into an analog feedback signal using a digital-to-analog converter, the digital-to-analog converter including a capacitances, receiving the analog feedback signal in the analog input stage, and generating a control signal from the digitized signal and a digital reference signal. The input resistance and the capacitance set a time constant, and the control signal adjusts the time constant to change the digitized signal until the digitized signal meets or crosses a threshold set by the digital reference signal.

The following detailed description and accompanying drawings provide a better understanding of the nature and advantages of the present invention.

DETAILED DESCRIPTION

Described herein are techniques for calibrating analog and digital circuits. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
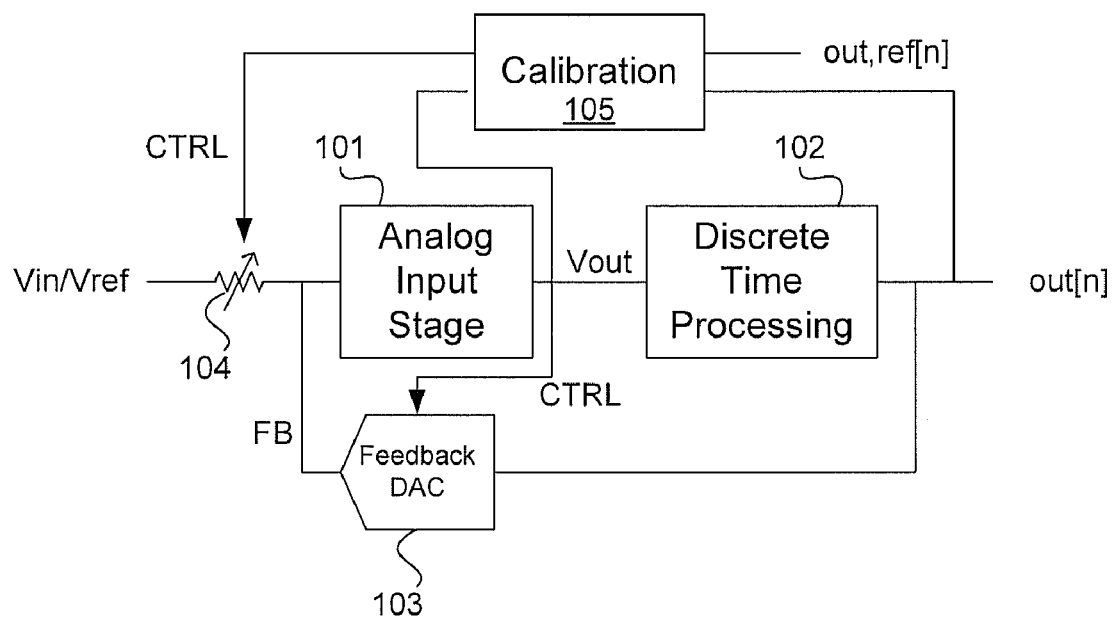
FIG. 1 illustrates calibration of analog and digital circuits according to one embodiment of the present invention.

FIG. 1 illustrates calibration of analog and digital circuits according to one embodiment of the present invention. Circuit 100 in FIG. 1 can be an analog-to-digital converter, for example. Circuit 100 includes an analog input stage 101, a discrete time processing stage 102, and a digital-to-analog converter ("DAC") 103 configured in a feedback loop from the output of discrete time processing stage 102 to the input of analog input stage 101. Analog input stage 101 is configured to receive an analog input signal through an input resistance 104. For example, during normal operation, the analog input signal can be received from a previous analog stage (e.g., analog signal Vin). In this case, the analog input signal is a continuous time signal that can have different properties dependent on the particular application. However, during a calibration phase, the analog input signal can be set at a first reference value (e.g., Vref) to calibrate the circuit as described in more detail below. Analog input stage 101 produces an analog output signal (e.g., signal Vout). A discrete time processing stage 102 is configured to receive the analog output signal and generate a digitized signal (e.g., out[n]) from the analog output signal. The digitized signal can be used for additional digital signal processing by other downstream circuits (not shown). Features and advantages of the present invention include a DAC 103 configured to receive the digitized signal and generate an analog feedback signal (e.g., signal FB) to the analog input stage 101, where the DAC 103 includes at least one capacitance. The capacitance of DAC 103 and input resistance 104 sets a time constant of the circuit. In one embodiment, a calibration circuit 105 is configured to receive the digitized signal and a digital reference signal (e.g., out,ref) and generate a control signal (e.g., signal CTRL). The control signal adjusts the time constant to change the digitized signal until the digitized signal crosses a threshold set by the digital reference signal. As illustrated in FIG. 1, the control signal can adjust either the value of the resistance 104 or parameters of the DAC (e.g., current sources or capacitors) to adjust the time constant. As mentioned above, the analog input signal can be set at a first reference value (e.g., a constant voltage), and as the time constant is adjusted the digitized signal changes. When the digitized signal crosses a threshold set by the digital reference signal, the circuit is calibrated and may enter normal operation.

Figure 2:
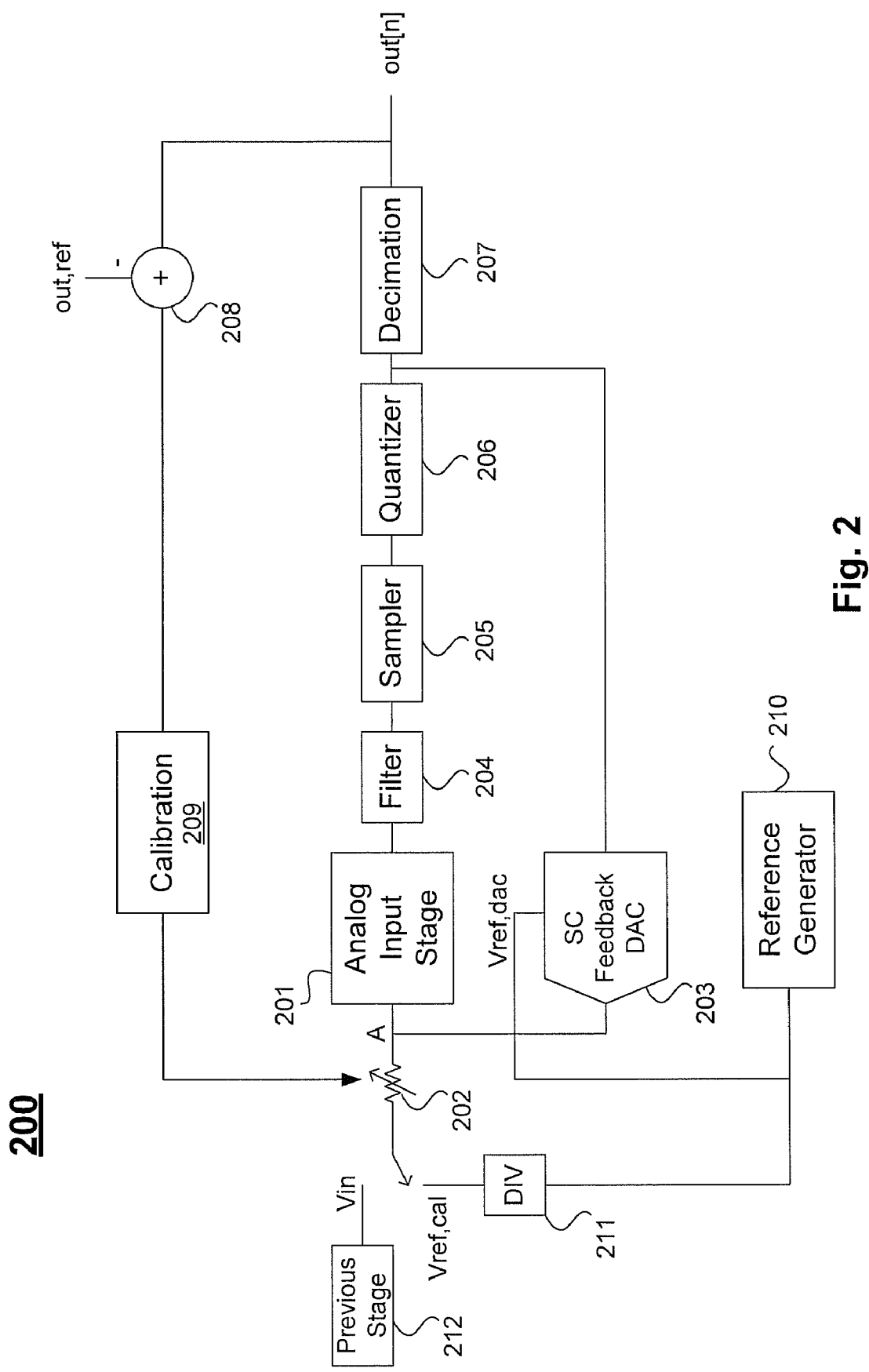
FIG. 2 illustrates calibration of an example system according to another embodiment of the present invention.

FIG. 2 illustrates calibration of an example system 200 according to another embodiment of the present invention. Example system 200 includes an analog input stage 201 having an input resistance 202. In this example implementation, the input resistance 202 is a digitally controlled variable resistance. The output of analog input stage 201 is coupled to several processing stages. In this example, the output of analog input stage 201 is coupled to a filter 204, sampler 205, quantizer 206, and decimation stage 207, which are configured in series. Here, filter 204 is an analog filter. However, the filter 204 could be implemented as a discrete time filter, and therefore, could be configured after sampler 205, for example. Filter 204 can limit the signal frequencies that are passed from the output of analog input stage 201 to sampler 205. Filter 204 can be a low pass filter, for example. Sampler 205 samples the value of the amplitude of the analog signal at discrete points in time. Example implementations of sampler 205 include sample and hold circuits, for example. Quantizer 206 receives the sampled amplitude values and translates the samples into discrete amplitude values represented by digital bits. Example implementations of quantizer 206 can be multiple comparators that each output one digital value if the sample is below a comparator specific reference voltage and output another digital value if the sample is above the comparator specific reference voltage. If the reference voltages of the comparators are distributed across a range, the output of the multiple comparators is a discrete representation of the amplitude of the sampled analog signal (with some quantization error). An example of such a circuit is provided below.

In this example, quantizer 206 generates a digitized signal that is fed back to analog input stage 201 through a switched-capacitor ("SC") feedback DAC 203. An input voltage received on one terminal of resistance 202 injects a current into node A on the other terminal of resistance 202. Additionally, DAC 203 receives the digitized signal and translates the digitized signal into a current into node A, for example. The current from the input signal combines with the current from DAC 203 to modify the composite input signal of analog input stage 201. Accordingly, during a calibration phase, one terminal of input resistance 202 is coupled to a reference voltage to set the analog input signal at a first reference value. In this example, reference generator 210 sets a reference voltage, Vref,dac, that is coupled to a voltage reference input of DAC 203. Additionally, in this example, the same reference generator 210 is coupled to the input of a voltage divider 211. The output of the voltage divider 211 establishes a second reference voltage, Vref,cal. The reference voltages are advantageously generated from the same reference generator in this example and may be accurately related to each other, for example. In particular, a ratio of the first reference value and second reference value is constant across process and temperature. The circuit can be calibrated using the generated references as set forth below. During normal operation, the input resistor is coupled to previous stage 212 and receives a signal Vin.

The input resistance 202 and the capacitance in DAC 203 set a time constant for the circuit. The time constant, in turn, determines the amplitude of the digitized signal generated in response to a particular reference value of the analog input signal (e.g., Vref,cal). In this example, the output of quantizer 206 is coupled to a decimation stage 207. Decimation stage 207 down samples the digital signal received from quantizer 206 and produces another digitized signal, out[n], for example. In some embodiments, the input of the feedback DAC 203 could use the digitized signal at the output of decimation stage 207. In this example, the digitized signal at the output of decimation stage 207 is used to calibrate the time constant. For instance, the digitized signal, out[n] (e.g., during calibration, a constant "out"), can be compared with a digital reference signal, out,ref, to track changes in the digital signal as the calibration process is carried out. In this example, a constant digitized signal, out, is combined with the digital reference signal, out,ref, as illustrated at addition stage 208. The difference between the signals is received by calibration stage 209. Calibration stage 209 generates a control signal to control the value of resistance 202. When calibration is initiated, calibration stage 209 configures input resistance 202 to a maximum resistance. During calibration, the analog input signal, which is set to Vref,cal, propagates through the analog and digital circuits (and around the feedback loop) and the digitized signal settles at a particular value. The resulting digitized signal, out, is combined with the digital reference signal, out,ref, and the difference between the signals is received by calibration stage 209. Calibration stage 209 produces new control signal values to incrementally reduce the input resistance, which reduces the difference between the digitized signal, out, and the digital reference signal, out,ref. The digital reference signal, out,ref, sets a threshold. As the time constant is adjusted by changing the value of input resistance 202, the digitized signal changes until the digitized signal crosses the threshold set by the digital reference signal. In one embodiment, the threshold can be determined when a sign bit changes, indicating that the relative values of the digitized signal and the digital reference signal have switched (e.g., the digitized signal has become larger than the digital reference signal). Once the threshold set by the digital reference signal is met or crossed, calibration can stop, and the calibration stage 209 stores the values for the control signal to set the final value of the input resistance 202, for example. While the above example illustrates one embodiment of the present invention starting with a maximum resistance, it is to be understood that a variety of search algorithms may be used to calibrate the circuit.

Figure 3:
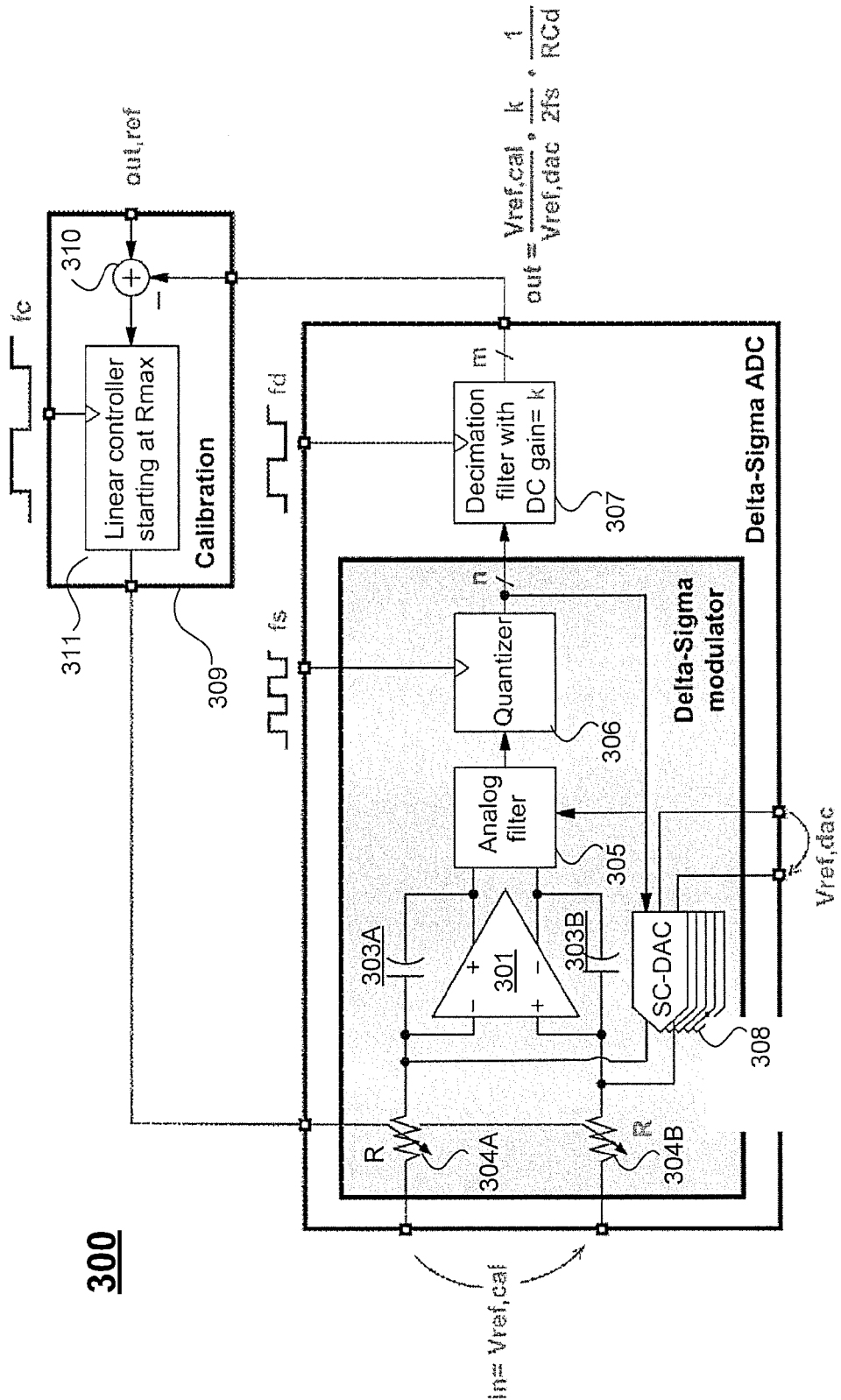
FIG. 3 illustrates calibration of an example delta-sigma converter according to another embodiment of the present invention.

FIG. 3 illustrates calibration of an example delta-sigma converter according to another embodiment of the present invention. Delta-sigma ADC 300 includes an analog integrator input stage that comprises amplifier 301, feedback capacitors 303A and 303B, and input resistors ("R") 304A and 304B. In this example, the analog input stage is a differential input stage and includes differential outputs coupled to an analog filter 305. Analog filter 305 can be either a continuous time ("CT") filter or a discrete time ("DT") filter. If a DT filter is used, the sampling process can occur at the input, for example. However, in this example a CT filter is used, and sampling occurs in the quantizer 306. The output of analog filter 305 is coupled to quantizer 306. In this example, quantizer 306 performs both time quantization (sampling) and amplitude quantization. Quantizer 306 receives a clock signal to set the sample frequency, fs.

The output of quantizer 306 is an n-bit digital signal, which is a digitized version of the input signal, and which is coupled to both decimation stage 307 and a plurality of 1-bit SC feedback DACs 308. Each SC feedback DAC includes approximately the same capacitance, Cd. SC feedback DACs 308 are switched at the sample frequency, fs, and the product of the capacitance of each SC feedback DAC and the sample frequency, fs, forms an equivalent resistance, Req. Accordingly, SC feedback DACs 308 translate the digitized signal at the output of quantizer 306 into a current (i.e., from charging and discharging one or more capacitors). The current from SC feedback DACs 308 is coupled to the differential input terminals of amplifier 301. Therefore, SC feedback DACs 308 establish a feedback loop with a time constant set by input resistances 304A and 304B and the capacitance, Cd, in the SC feedback DACs 308. The time constant is set according to the product R*Cd.

As mentioned above, the output of quantizer 306 is received by decimation stage 307. In this example, decimation stage 307 down-samples the n-bit digital signal at the output of quantizer 306 to an m-bit digital signal, out. Additionally, in this implementation decimation stage 307 filters the n-bit digital signal and includes a DC gain, k. Decimation stage 307 receives a second clock signal having a second frequency, fd, that is a fraction of the sample frequency corresponding to the amount of down-sampling. For example, in one embodiment, decimation stage 307 low pass filters the digital input signal by averaging input samples. Additionally, decimation stage 307 periodically eliminate samples. The result is a digitized signal with fewer samples and more bits per sample, for example. Decimation stage 307 can be a third-order decimation stage, such as a SINC, for example.

The output of decimation stage 307 is received by calibration stage 309. Calibration stage 309 includes an adding stage 310 and a linear controller 311. Calibration stage 309 can be implemented as a fully digital circuit, for example. Calibration stage 309 receives the digitized signal, out, and a digital reference signal, out,ref. In this example, the difference between out and out,ref is determined at adding stage 310, where out is received on a negative ("−") input to result in a subtraction, and the result is received by linear controller 311. Linear controller 311 controls the calibration process, for example, by executing a calibration algorithm. Linear controller 311 receives a third clock signal having a third clock frequency, fc, that is less than both the sample frequency, fs, and the frequency of the decimation stage clock, fd. The clock frequency, fc, of linear controller 311 can be sufficiently below the clock frequency, fd, of decimation stage 307 to allow the loop to settle out to final values of the digitized signal, out. In some embodiments, delays (e.g., $z^{-1}$) are inserted between the output of decimation stage 307 and the input of calibration stage 309 to account for latency in the forward signal path and improve loop stability. The clock signal with frequency fc may be used to trigger the next calibration step once the signal "out" has settled to a value related to the current value of the R*Cd product.

During a calibration phase, the differential input terminals of resistors 304A and 304B of the analog input stage are coupled to a differential input reference voltage, Vref,cal. Additionally, a differential DAC reference voltage, Vref,dac, can be generated for each of the feedback DACs 308. Under these conditions, the digitized signal at the output is expressed as follows:

$$\text{out} = \frac{Vref, cal}{Vref, dac} * \frac{k}{2fs} * \frac{1}{RCd}$$

Vref,cal and Vref,dac can be set at constant voltages. Vref,cal is a well known and accurate fraction of Vref,dac. Decimation stage 307 gain, k, is known. Finally, the sampling frequency, fs, is known and can be very accurate. Therefore, a value of the digitized signal, out, corresponding to a desired value of the time constant, RCd, can be set by the digital reference signal, out,ref. According to one algorithm that may be executed by linear controller 311, input resistors 304A and 304B are initially set to their maximum values. The values of the resistors can be incrementally reduced until the digitized signal, out, converges on the digital reference signal, out,ref. When out=out,ref, the desired value of RCd is obtained.

Figure 4A:
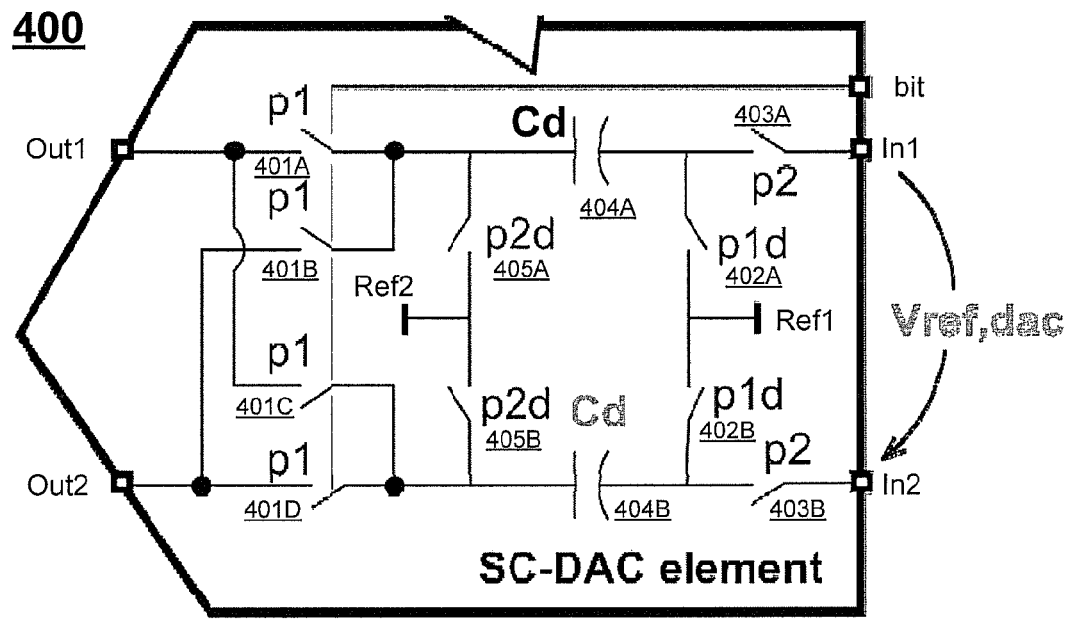
FIGS. 4A-B illustrates an example switched capacitor digital-to-analog converter and clock signals.
Figure 4B:
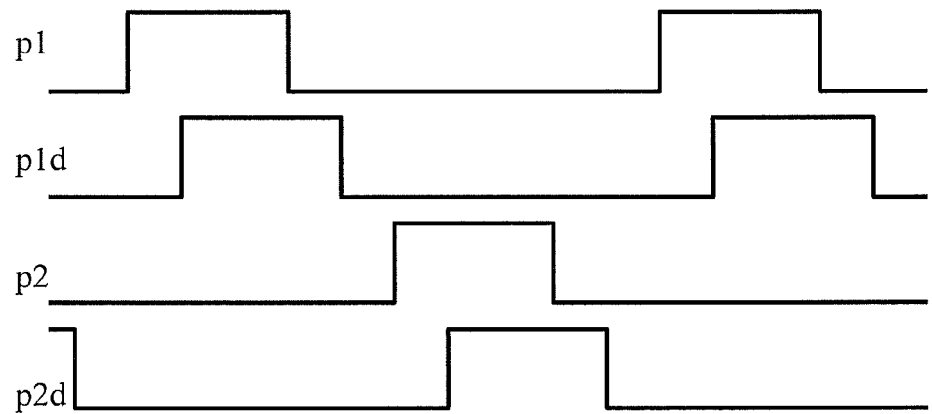

FIG. 4A illustrates an example switched capacitor digital-to-analog converter ("SC DAC"). SC-DAC 400 includes differential inputs In1 and In2 for receiving a differential DAC reference voltage, Vref,dac. SC-DAC 400 further includes a bit input for receiving one of a plurality of feedback bits of the digitized signal. Switches 401A-D are controlled by the value of the bit. Switches 403A-B selectively couple the inputs In1 and In2 to respective terminals of DAC capacitors 404A and 404B. Both of the capacitors 404A and 404B have the same capacitance value, Cd. Switches 402A-B selectively couple terminals of capacitors 404A and 404B to a reference voltage, Ref1. Similarly, switches 405A-B selectively couple the other terminals of DAC capacitors 404A and 404B to reference voltage, Ref2. Ref1 and Ref2 may be the same voltages, for example. The clock signals used to perform sampling may have two phases, which may be used to drive switches in SC-DAC 400. A first phase is denoted p1, and the second phase is denoted p2, which are non-overlapping clock signals having delayed versions p1d and p2d. The clock signals are illustrated in FIG. 4B. During phase p1, whether bit is one or zero, either 401A&D or 401B&C are activated. Thus, the charge stored in the capacitors is released in the integrator virtual ground (out1, out2) either directly or in an inverted way. The differential capacitances, Cd, are charged to Vref,dac during one phase of the clock, and the charge is selectively coupled to either the positive or negative input of amplifier 301 based on value of the input bit.

Figure 5:
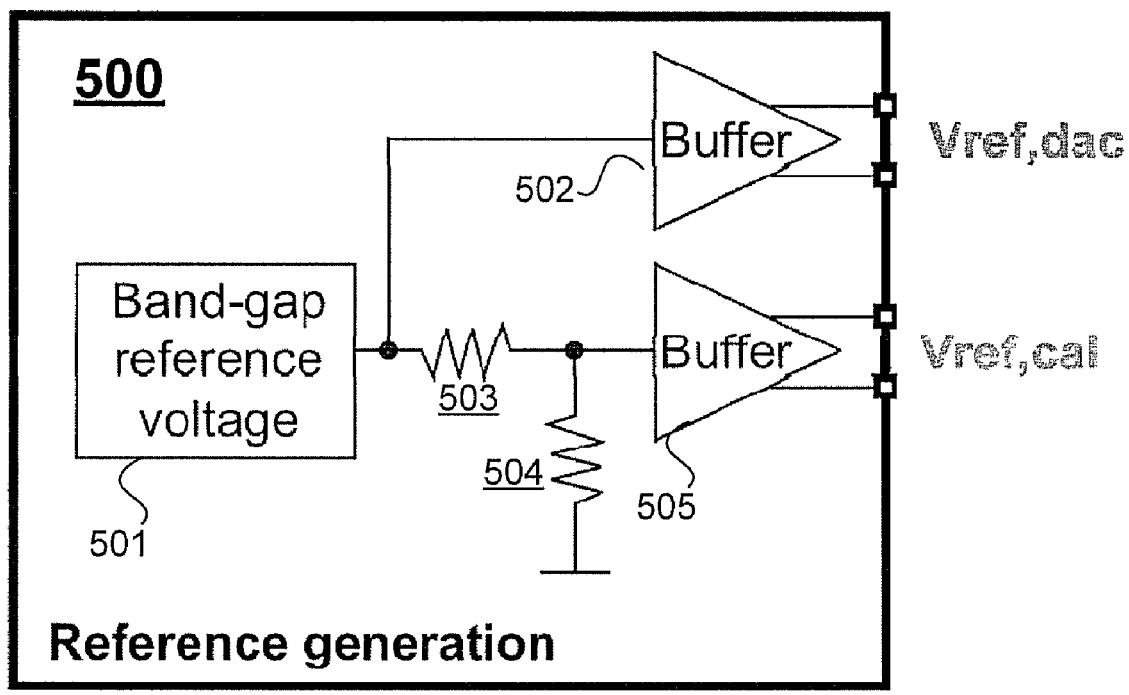
FIG. 5 illustrates an example reference generator circuit.

FIG. 5 illustrates an example reference generator circuit 500. In this example, a differential DAC reference voltage, Vref,dac, and a differential input reference voltage, Vref,cal, can be generated from the same band-gap circuit 501. A band-gap voltage from band-gap circuit 501 is coupled to buffer 502 to generate the differential DAC reference voltage, Vref,dac. Additionally, the band-gap voltage from band-gap circuit 501 is coupled to the input of a resistor divider including resistor 503 and resistor 504 to divide down the voltage. The output of the resistor divider is coupled to buffer 502 to generate differential input reference voltage, Vref,cal. Accordingly, Vref,cal is a well controlled fraction of Vref,dac, which depends on the matching of elements in the resistor divider in this example. Buffers 502 and 503 allow each voltage to be driven into a load, such as the multiple capacitors across the multiple SC DACs, for example.

Figure 6:
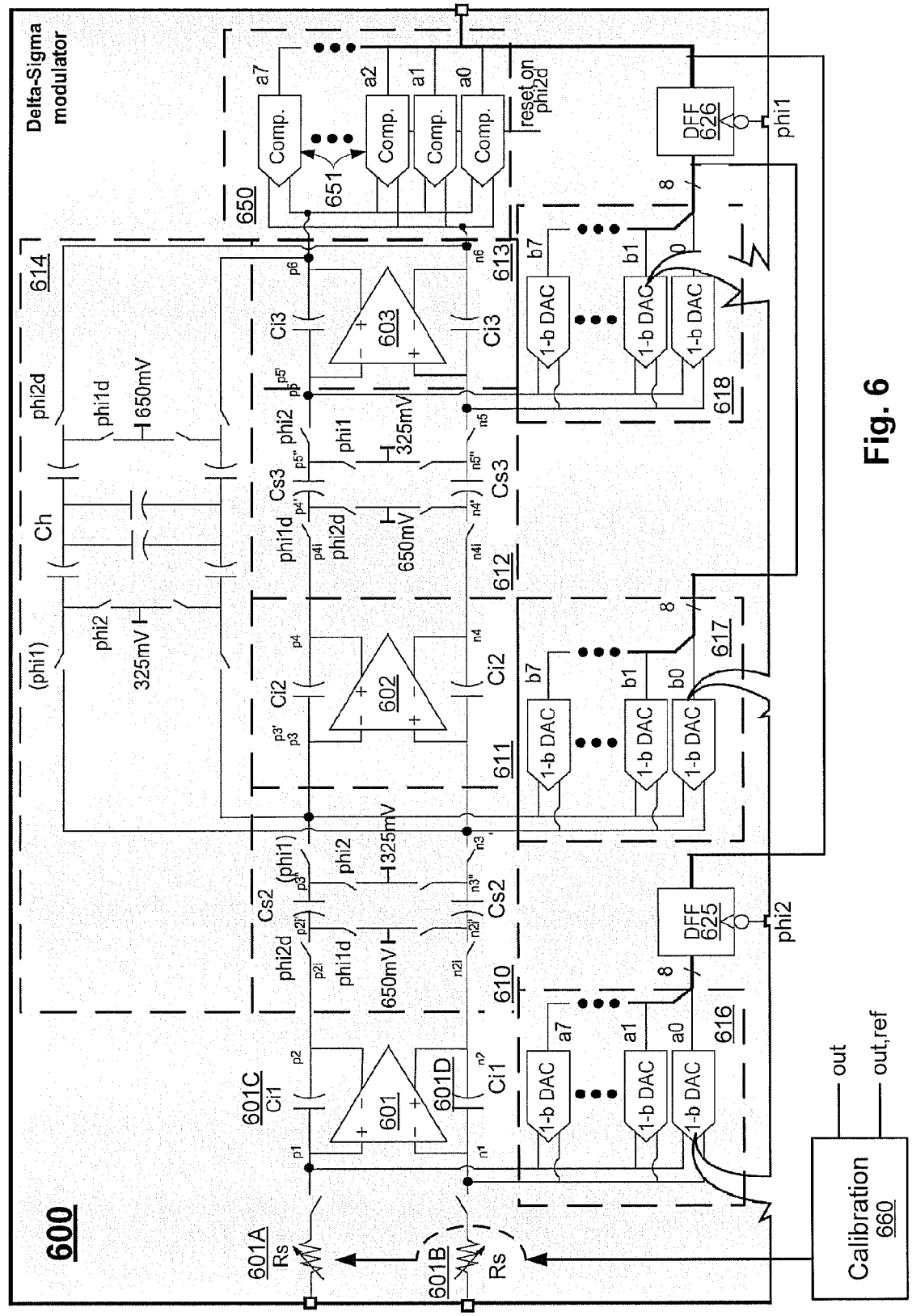
FIG. 6 illustrates calibration of another example delta-sigma converter according to another embodiment of the present invention.

FIG. 6 illustrates calibration of another example delta-sigma converter according to another embodiment of the present invention. Circuit 600 illustrates an embodiment of the present invention implemented with a third-order 9-level delta-sigma modulator. For example, the output of the quantizer may be a thermometer code, where 8 bits result in 9 possibilities:
0: 00000000
1: 10000000
2: 11000000
3: 11100000
4: 11110000
5: 11111000
6: 11111100
7: 11111110
9: 11111111
Circuit 600 includes amplifiers 601-603 that form the core of the analog section. A differential analog integrator input stage is built around amplifier 601 and includes programmable inputs resistors (e.g., Rs,max=190 kohms) 601A-B and feedback capacitors (e.g., Ci1=2.499 pf) 601C-D. A switch-capacitor ("SC") filter is coupled to the output of the input stage. The SC filter includes stages 610-614 delineated with dashed lines. A first SC stage 610 couples samples of the analog signal from the output of amplifier 601 to a second amplifier 602 in stage 611. Stage 611 is also configured with feedback capacitors (e.g., Ci2=440 f) to form an integrator. The first SC stage 610 includes differential switched capacitors (e.g., Cs2=330 f) for storing sample values. A second SC stage 612 couples samples of the output of amplifier 602 to a third amplifier 603 in stage 613. Stage 613 is also configured with feedback capacitors (e.g., Ci3=275 f) to form an integrator. The second SC stage 612 includes differential switched capacitors (e.g., Cs3=440 f) for storing sample values. A third SC stage 614 is configured as a feedback stage to couple samples of the output of amplifier 603 to amplifier 601 in stage 611. The third SC stage 614 provides SC feedback capacitances, Ch, configured as shown (e.g., Ch=2.4 f), for example. Ch is the value emulated with this H-network. Namely, the charge transfer is equivalent to having two capacitors, Ch, conventionally placed in parallel without the cross-coupling capacitors. The SC filter performs sampling and filtering, for example. The outputs of the SC filter are differential discrete time samples, which are coupled to quantizer 650.

Quantizer 650 includes multiple comparators 651. Each comparator has a differential input coupled to receive the differential discrete time output of the SC filter. As mentioned above, the comparators 651 receive a differential discrete time sample as a voltage, and compare the voltage to different comparator threshold values to generate digital outputs [a0 . . . a7] as a result. For example, the comparator generating a0 outputs a voltage representing zero (e.g., 0 volts) if the differential sample voltage is less than a minimum voltage step, Vmin (e.g., Vmin=81.25 mV for a 650 mV maximum or Vmax/8), and the same comparator outputs a voltage representing one (e.g., 650 mV) if the differential sample voltage is greater than the minimum voltage step, Vmin. For the comparator generating a0, Vmin can be used as the threshold voltage. The comparator generating a1 can use, 2*Vmin, for example, and the comparator generating a2 can use 3*Vmin, and so on for the remaining comparators in the quantization stage. The output of quantizer 650 is an 8-bit digitized signal. A resistance ladder may be used to generate the 8 differential reference voltages, each separated with the same quantization step. With a quantization step of 80 mV for example, the 8 reference voltages would be ±280 mV, ±200 mV, ±120 mV and ±40 mV (referred to as a mid-thread quantizer). If 8 levels are used, the quantizer can be mid-rise with 7 reference voltages ±240 mV, ±160 mV, ±80 mV and 0 mV. These are the thresholds of the comparators. In our 9-level case, if the quantizer input is −143.3 mV, the output would be 11000000. Or with +79.6 mV the output would be 11111000, for example. It is to be understood that the above description is merely one of a variety of quantization circuits could be used.

Figure 7A:
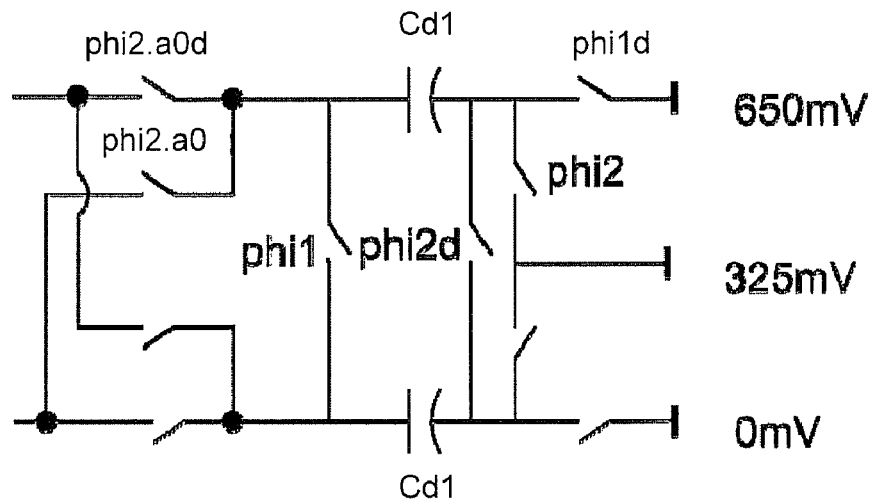
FIGS. 7A-C illustrate example switched capacitor digital-to-analog converters.
Figure 7B:
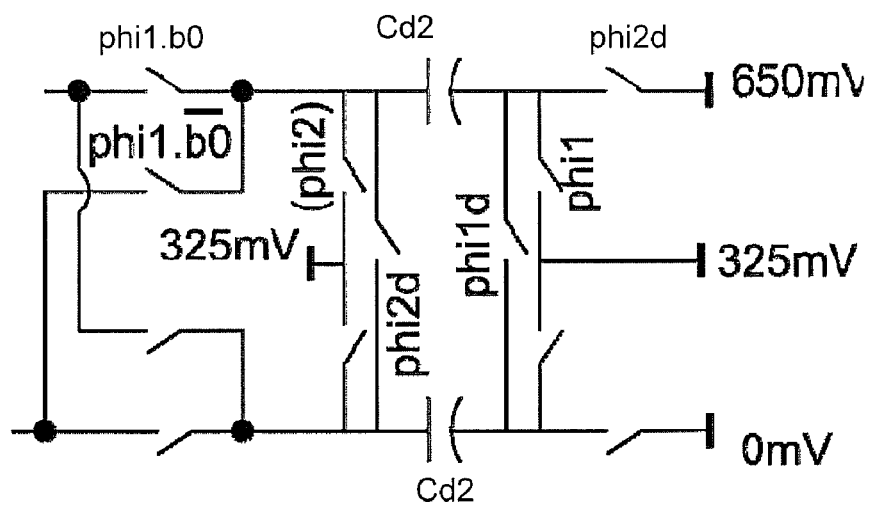
Figure 7C:
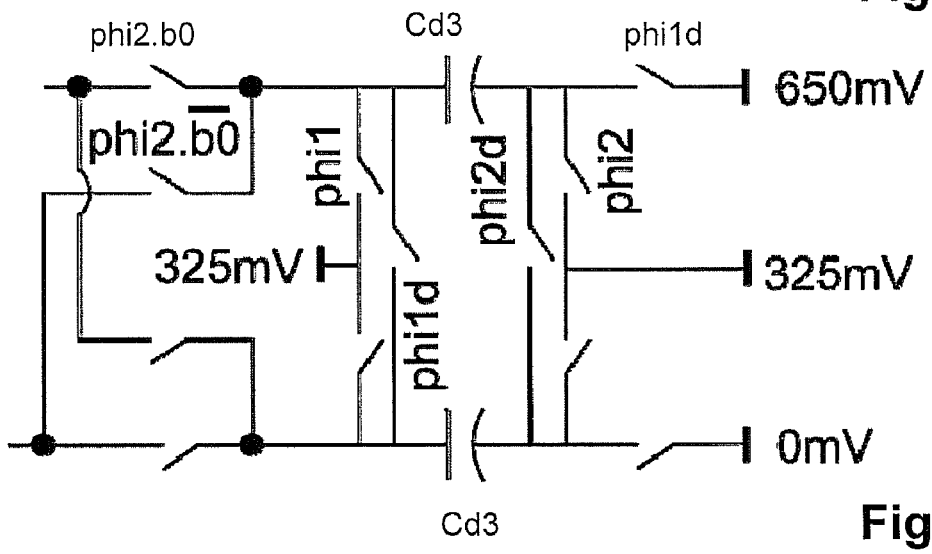

The output of quantizer 650 may be coupled to amplifiers 601-603 through SC feedback DACs 616-618, respectively. For instance, the SC filter includes a first SC feedback DAC stage 617 coupled between the output of quantizer 650 and the input of amplifier 602. Similarly, a second SC feedback DAC stage 618 is coupled between the output of quantizer 650 and the input of amplifier 603. Stages 617 and 618 receive the 8-bit output of quantizer 650 through an array of eight (8) D flip flops, which are clocked on the first phase of the sample clock (phi1) as illustrated at 626. Similarly, SC feedback DAC stage 616 is coupled between the output of quantizer 650 and the input of amplifier 601, and receives the 8-bit output of quantizer 650 through an array of eight (8) D flip flops, which are clocked on the second phase of the sample clock (phi2) as illustrated at 625. FIGS. 7A-C illustrate example switched capacitor digital-to-analog converters. FIG. 7A illustrates a 1-bit SC DAC that may be used in stage 616, where the capacitance of each SC DAC is Cd1 (e.g., Cd1=147 f). FIG. 7B illustrates a 1-bit SC DAC that may be used in stage 617, where the capacitance of each SC DAC is Cd2 (e.g., Cd2=55 f). FIG. 7C illustrates a 1-bit SC DAC that can be used in stage 618, where the capacitance of each SC DAC is Cd3 (e.g., Cd1=55 f).

Resistors 601A and 601B receive digital control signals to change the resistor values from calibration circuit 660. Calibration circuit 660 receives a digitized signal, out, and a reference, out,ref, and uses the reference as a threshold for calibration as described above. Calibration circuit 660 tunes the RC time constant set by resistors, Rs, and capacitances, Cd1, in FIG. 7A, for example.

Figure 8:
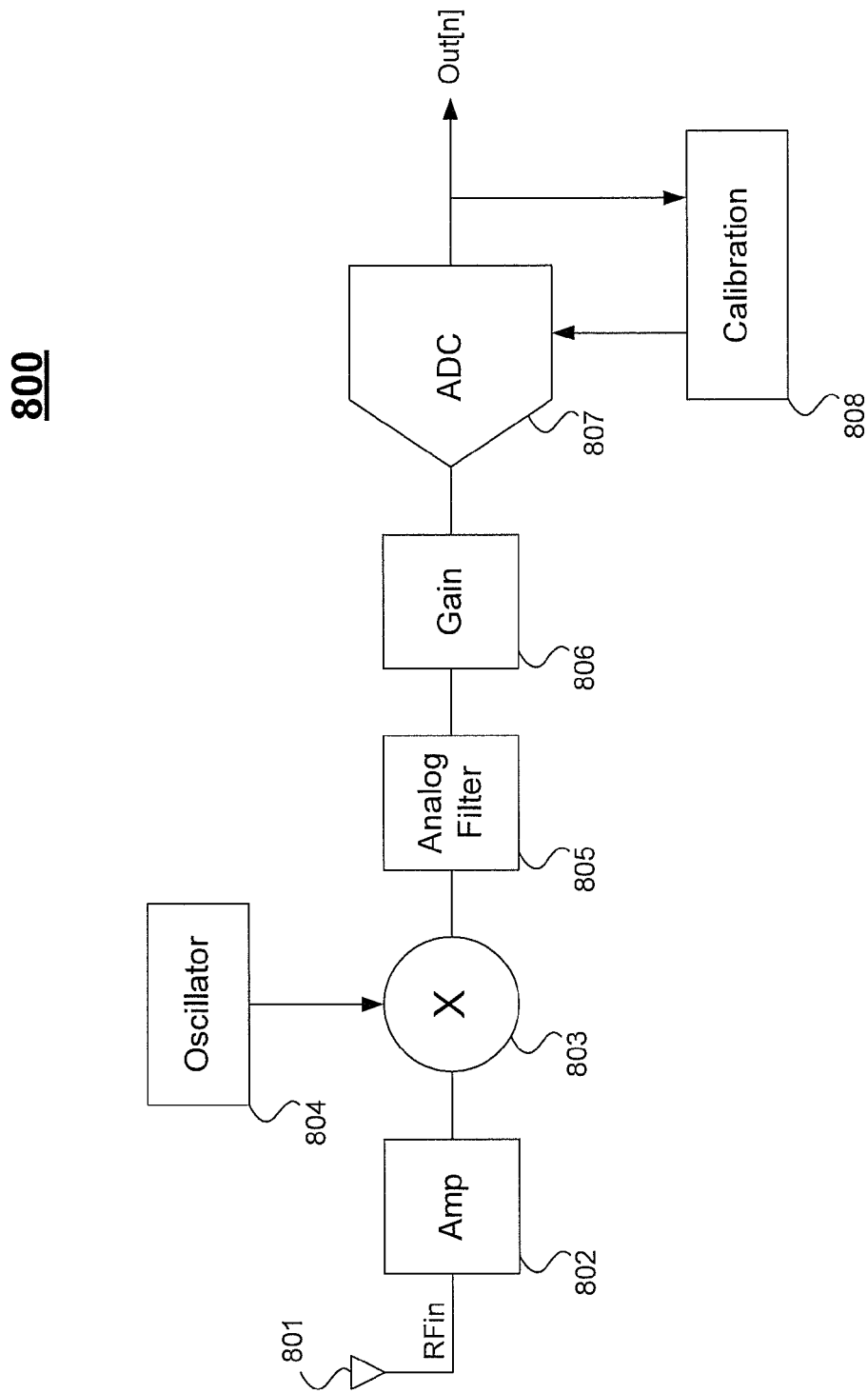
FIG. 8 illustrates an example application of analog and digital circuit calibration according to another embodiment of the present invention.

FIG. 8 illustrates an example application of analog and digital circuit calibration according to another embodiment of the present invention. In this example, the circuits and calibration techniques described above can be used to improve the performance of a wireless communication system 800. Wireless communication system 800 receives a radio frequency signal ("RFin") on an antenna 801 and amplifies the received signal in an amplifier 802. RFin can include information modulated onto a carrier frequency, for example. A mixer 803 receives the amplified RF signal together with a signal from oscillator 804. Oscillator 804 generates a signal having a frequency that is approximately equal to the modulation frequency of RFin. Mixer 803 demodulates (or down-converts) the RF signal to baseband. It is to be understood that demodulation may occur in one or more steps. Analog filter 805 removes frequencies outside the frequencies of interest. The output of filter 805 can be amplified in one or more gain stages 806. The one or more gain stages 806 can provide automatic gain control, for example, to optimized the amplitude of the received signal for the range of ADC 807. ADC 807 outputs a digitized signal, out[n]. This signal is received by calibration circuit 808, which can generate control signal for calibrating the ADC as described in the different embodiments disclosed above to improve the performance of the communication system.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A circuit comprising:
   an analog input stage configured to receive an analog input signal through an input resistance and produce an analog output signal;
   a discrete time processing stage configured to receive the analog output signal and generate a digitized signal from the analog output signal;
   a digital-to-analog converter configured to receive the digitized signal and generate an analog feedback signal to the analog input stage, the digital-to-analog converter including a capacitance; and
   a calibration circuit configured to receive the digitized signal and a digital reference signal and generate a control signal,
   wherein the input resistance and the capacitance set a time constant, and
   wherein the control signal adjusts the time constant to change the digitized signal until the digitized signal meets or crosses a threshold set by the digital reference signal.

2. The circuit of claim 1, wherein the digital-to-analog converter comprises a switched capacitor digital-to-analog converter.

3. The circuit of claim 2, wherein:
   the analog input signal is set to a first reference value;
   the switched capacitor digital-to-analog converter is configured to receive a second reference value; and
   a ratio of the first reference value and second reference value is constant.

4. The circuit of claim 3, further comprising:
   a reference generator circuit configured to generate the second reference value; and
   a voltage divider having an input coupled to the reference generator circuit, the voltage divider further having an output to provide the first reference value.

5. The circuit of claim 4, wherein the reference generator circuit is a band-gap circuit.

6. The circuit of claim 1, wherein the input resistance is variable, and wherein the control signal adjusts the input resistance.

7. The circuit of claim 1, wherein:
   the input resistance is variable; and
   the calibration circuit configures the input resistance to a maximum resistance and incrementally reduces the input resistance.

8. The circuit of claim 1, wherein:
   the analog input stage is an integrator; and
   the discrete time processing stage comprises a filter, a sampler, and a quantizer configured in series.

9. The circuit of claim 8, wherein:
   the discrete time processing stage further comprises a decimation filter;
   the digital-to-analog converter receives a first digitized signal from an output of the quantizer; and
   the calibration circuit receives a second digitized signal from an output of the decimation filter.

10. The circuit of claim 1, wherein the analog input stage and the discrete time processing stage comprise a low-pass delta-sigma modulator.

11. The circuit of claim 1, wherein:
   during a calibration phase, the analog input signal is set at a first reference value; and
   during normal operation, the analog input signal is received from a previous analog stage.

12. A wireless communication system comprising the circuit of claim 1.

13. A calibration method comprising:
   receiving an analog input signal in an analog input stage through an input resistance to produce an analog output signal;
   converting the analog output signal into a digitized signal;
   converting the digitized signal into an analog feedback signal using a digital-to-analog converter, the digital-to-analog converter including a capacitance;
   receiving the analog feedback signal in the analog input stage; and
   generating a control signal from the digitized signal and a digital reference signal,
   wherein the input resistance and the capacitance set a time constant, and
   wherein the control signal adjusts the time constant to change the digitized signal until the digitized signal meets or crosses a threshold set by the digital reference signal.

14. The method of claim 13, wherein the digital-to-analog converter comprises a plurality of 1-bit switched capacitor digital-to-analog converters each having approximately the same capacitance value, and wherein the capacitance value is said capacitance.

15. The method of claim 14, wherein:
   the analog input signal is set to a first reference value;
   the first reference value is a first reference voltage;
   each 1-bit switched capacitor digital-to-analog converter receives a second reference voltage; and
   the method further comprises:
      generating the second reference voltage using a first reference generator; and
      dividing the second reference voltage to generate the first reference voltage.

16. The method of claim 13, wherein:
the input resistance is variable; and
the control signal adjusts the input resistance.

17. The method of claim 13, wherein:
the input resistance is variable; and
the input resistance is set to a maximum resistance and incrementally reduced.

18. The method of claim 13, further comprising filtering, sampling, and quantizing the analog output signal.

19. The method of claim 18, further comprising decimating a signal resulting from said quantizing, wherein said converting the digitized signal comprises converting a first digitized signal resulting from said quantizing into said analog feedback signal, and wherein said generating a control signal comprises generating a control signal from a second digitized signal resulting from said decimating.

20. The method of claim 13, wherein:
during a calibration phase the analog input signal is set at a first reference value; and
during normal operation the analog input signal is received from a previous analog stage.

* * * * *